(12) United States Patent
Miyoshi

(10) Patent No.: US 6,466,016 B1
(45) Date of Patent: Oct. 15, 2002

(54) MAGNETIC RESONANCE IMAGING PHASE CORRECTION FROM PIXEL POSITIONS METHOD AND APPARATUS

(75) Inventor: Mitsuharu Miyoshi, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 74 days.

(21) Appl. No.: 09/685,816

(22) Filed: Oct. 10, 2000

(30) Foreign Application Priority Data

Oct. 22, 1999 (JP) .................................. 11-301078

(51) Int. Cl.[7] ............................................. G01V 3/00
(52) U.S. Cl. ................ 324/312; 324/307; 324/309; 324/318; 324/322
(58) Field of Search ................. 324/312, 307, 324/309

(56) References Cited

U.S. PATENT DOCUMENTS

| | | | | |
|---|---|---|---|---|
| 4,665,366 A | * | 5/1987 | Macovski | 324/307 |
| 4,823,085 A | * | 4/1989 | Fuderer et al. | 324/309 |
| 5,162,737 A | * | 11/1992 | Nozokido et al. | 324/307 |
| 5,208,534 A | * | 5/1993 | Okamoto et al. | 324/307 |
| 5,341,099 A | * | 8/1994 | Suzuki | 324/307 |
| 5,371,465 A | * | 12/1994 | Onodera et al. | 324/307 |
| 5,528,703 A | * | 6/1996 | Lee | 382/100 |
| 5,578,923 A | * | 11/1996 | Chen | 128/925 |
| 5,742,163 A | * | 4/1998 | Liu et al. | 324/307 |
| 5,800,354 A | * | 9/1998 | Hofland et al. | 324/309 |
| 5,864,234 A | * | 1/1999 | Ludeke | 324/307 |
| 5,909,119 A | * | 6/1999 | Zhang et al. | 324/307 |
| 6,091,243 A | * | 7/2000 | Xiang et al. | 324/307 |
| 6,147,492 A | * | 11/2000 | Zhang et al. | 324/307 |
| 6,192,263 B1 | * | 2/2001 | Ma | 324/309 |

* cited by examiner

Primary Examiner—Edward Lefkowitz
Assistant Examiner—D. Vargas
(74) Attorney, Agent, or Firm—Moonray Kojima

(57) ABSTRACT

To calculate a precise phase map even when there is a local phase disturbance and perform this phase correction, an image acquired by magnetic resonance imaging is subjected to lowpass filtering (702), pixel positions for which the ratio of a value after filtering to a value before filtering does not exceed a predetermined ratio are detected (704), a phase distribution excluding pixel data at these positions is calculated, and the phases at the excluded pixel positions are estimated from the phases of neighboring pixel positions to provide compensation so as to complete a phase map.

17 Claims, 13 Drawing Sheets

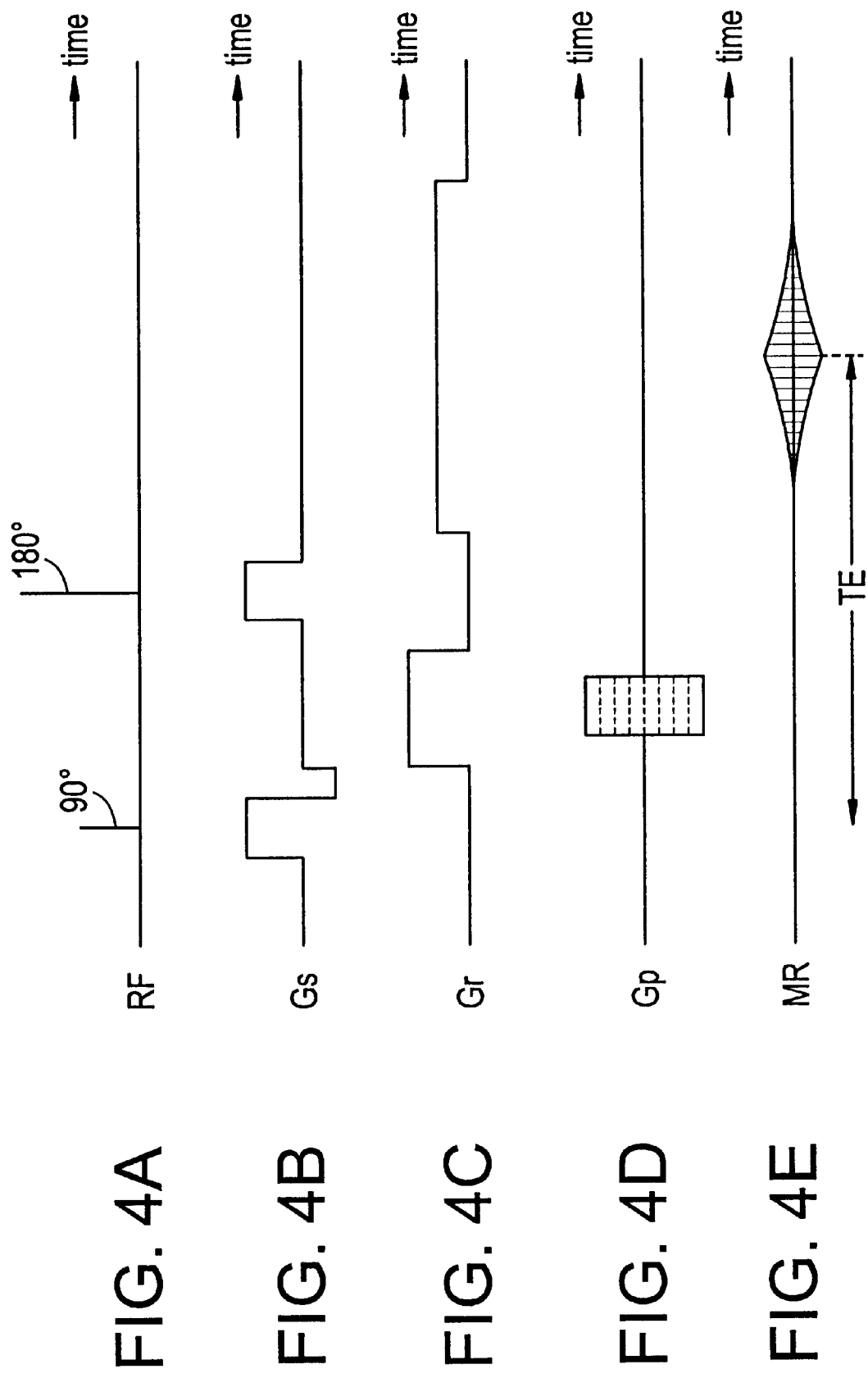

MAGNETIC RESONANCE IMAGING PHASE CORRECTION FROM PIXEL POSITIONS METHOD AND APPARATUS

BACKGROUND OF THE INVENTION

This invention relates to a phase distribution measurement method and apparatus, phase correction method and apparatus, and magnetic resonance imaging method and apparatus, and more specifically, to a method and apparatus for measuring the phase distribution in an image obtained by magnetic resonance imaging, to a method and apparatus for correcting the phase of pixel data based on the measured phase distribution, and to a magnetic resonance imaging method and apparatus which obtains water and lipid images based on the phase-corrected pixel data.

In a magnetic resonance imaging apparatus, a stationary magnetic field is formed in a space which houses an imaging object, a gradient magnetic field and a high frequency magnetic field are formed in the stationary magnetic field space, and an image is formed (reconstituted) based on a magnetic resonance signal generated by the spin of the imaging object. Due to a chemical shift, the magnetic resonance signal of lipids has a different frequency from the magnetic resonance signal of water, so water and lipids can be imaged separately using a phase difference based on the frequency difference.

The phase of the magnetic resonance signal is affected by the non-uniformity of the stationary magnetic field intensity, so in order to image water and lipids separately without being affected by the magnetic field non-uniformity, a phase distribution, i.e. phase map, representing the stationary magnetic field non-uniformity, is calculated, and phase correction of the image is performed based thereon.

The phase map is obtained by calculating the phase of image data given by complex numbers for each pixel. To obtain a precise phase map, noise is first removed by processing the image with a lowpass filter.

FIGS. 1(A) and 1(B) show the concept of the phase map for a typical one-dimensional image. The origin of the phase map is taken as the center of the stationary magnetic field. The phase at the origin is 0. This diagram is a phase map when the stationary magnetic field intensity has a linear gradient, and the phase varies linearly according to the distance from the origin. When the phase exceeds $+\pi$, it returns to the $-\pi$ side, and when it exceeds $-\pi$, it returns to the $+\pi$ side, as shown by (a) in the figure. In other words, phase wrap around takes place.

Therefore, in parts where there is wraparound, a correction for wrap around, i.e. unwrapping, is performed to obtain a phase map without wraparound, as shown in FIG. 1(b). The presence or absence of wraparound is detected by whether or not the absolute value of the phase difference of the image data for adjacent pixels is $2\pi$, and for pixels where wraparound is detected, $2\pi$ is added to the phase with a reverse sign to that of the phase difference.

When lowpass filtering was performed on the image as a preliminary step to calculating the phase map, the pixel data was locally disturbed in some places resulting from change in the magnetization of the imaging object, phase variation due to lipids, ghosting due to blood circulation or body movement, or high noise. In these places, it appeared as if there were a wraparound phase state, but a precise phase map could not be obtained by performing unwrapping based thereon.

Further, if the magnetic field nonuniformity is nonlinear, the phase map comprises high order components. Lowpass filtering must be set so that these high order components are not removed, but this lowpass filtering setting is not easy to perform.

SUMMARY OF THE INVENTION

It is an object of this invention to provide a phase distribution measuring method and apparatus which can calculate a precise phase map even when there is local phase disturbance, to provide a phase correction method and device using this calculated phase map, and to produce a magnetic resonance imaging method and apparatus which implements this phase correction.

It is a further object of this invention to provide a phase correction method and apparatus which permits an easy phase correction including high frequency components, and to provide a magnetic resonance imaging method and apparatus which performs such a phase correction.

The invention from one aspect for resolving the aforesaid problems is a phase distribution measuring method, comprising the steps of lowpass filtering an image obtained by magnetic resonance imaging, detecting pixel positions for which the ratio of a value after lowpass filtering to a value before lowpass filtering does not exceed a predetermined ratio by comparing pixel data for each corresponding pixel for an image before lowpass filtering and an image after lowpass filtering, calculating a phase distribution based on the image before lowpass filtering or the image after lowpass filtering excluding pixel data at the detected pixel positions, and compensating by estimating the phase at said excluded pixel positions in the calculated phase distribution from the phase at neighboring pixel positions.

In the invention from this aspect, pixel data for each corresponding pixel are compared for an image before and after lowpass filtering, pixel positions where there is a phase disturbance are detected, a phase map is calculated excluding pixel data at these pixel positions, and compensation is then made by estimating the phase at the excluded pixel positions from the phase at neighboring pixel positions so as to obtain a phase map without anomalies.

The invention from another aspect for resolving the above problems is a phase distribution measuring apparatus, comprising a filtering means which lowpass filters an image obtained by magnetic resonance imaging, a pixel position detecting means which detects pixel positions for which the ratio of a value after lowpass filtering to a value before lowpass filtering does not exceed a predetermined ratio by comparing pixel data for each corresponding pixel for an image before lowpass filtering and an image after lowpass filtering, a phase distribution calculating means which calculates a phase distribution based on the image before lowpass filtering or the image after lowpass filtering excluding pixel data at the detected pixel positions, and phase compensating means which compensates by estimating the phase at the excluded pixel positions in the calculated phase distribution from the phase at neighboring pixel positions.

In the invention from this aspect, pixel data for each corresponding pixel are compared for an image before and after lowpass filtering by the pixel position detecting means to detect pixel positions where there is a phase disturbance, a phase map is calculated excluding pixel data at these pixel positions by the phase distribution calculating means, and compensation is then made by the phase compensating means which estimates the phase at the excluded pixel positions from the phase at neighboring pixel positions so as to obtain a phase map without anomalies.

The invention from another aspect for resolving the above problems is a phase correction method, comprising the steps of lowpass filtering an image obtained by magnetic resonance imaging, detecting pixel positions for which the ratio of a value after lowpass filtering to a value before lowpass filtering does not exceed a predetermined ratio by comparing pixel data for each corresponding pixel for an image before lowpass filtering and an image after lowpass filtering, calculating a phase distribution based on the image before lowpass filtering or the image after lowpass filtering excluding pixel data at the detected pixel positions, compensating by estimating the phase at the excluded pixel positions in the calculated phase distribution from the phase at neighboring pixel positions, and performing phase correction of the image using the compensated phase distribution.

In the invention from this aspect, pixel data for each corresponding pixel are compared for an image before and after lowpass filtering, pixel positions where there is a phase disturbance are detected, a phase map is calculated excluding pixel data at these pixel positions, and compensation is made by estimating the phase at the excluded pixel positions from the phase at neighboring pixel positions so as to obtain a phase map without anomalies. The image data is then phase-corrected using this phase map.

The invention from another aspect for resolving the above problems is a phase correction method, comprising the steps of lowpass filtering an image obtained by magnetic resonance imaging, calculating a phase distribution based on the lowpass filtered image, phase-correcting the image before lowpass filtering based on the calculated phase distribution, lowpass filtering the phase-corrected image again, calculating a new phase distribution based on the new lowpass filtered image, and performing a new phase correction of the phase-corrected image based on the new calculated phase distribution.

In the invention from this aspect, a first phase map is calculated from the lowpass filtered image, the image before lowpass filtering is phase-corrected based on this phase map, the phase-corrected image is lowpass filtered again, a second phase map is calculated from this image, and the image which was phase-corrected by the first phase map is then phase-corrected by the second phase map. By repeating this phase correction plural times, a phase map comprising high-order components is obtained.

The invention from another aspect for resolving the above problems is a phase correction apparatus, comprising a filtering means which lowpass filters an image obtained by magnetic resonance imaging, a pixel position detecting means which detects pixel positions for which the ratio of a value after lowpass filtering to a value before lowpass filtering does not exceed a predetermined ratio by comparing pixel data for each corresponding pixel for an image before lowpass filtering and an image after lowpass filtering, a phase distribution calculating means which calculates a phase distribution based on the image before lowpass filtering or the image after lowpass filtering excluding pixel data at the detected pixel positions, a phase compensating means which compensates by estimating the phase at the excluded pixel positions in the calculated phase distribution from the phase at neighboring pixel positions, and a phase correcting means which performs a phase correction of the image using the compensated phase distribution.

In the invention from this aspect, pixel data for each corresponding pixel are compared for an image before and after lowpass filtering by the pixel position detecting means to detect pixel positions where there is a phase disturbance, a phase map is calculated excluding pixel data at these pixel positions by the phase distribution calculating means, and compensation is made by the phase compensating means which estimates the phase at the excluded pixel positions from the phase at neighboring pixel positions so as to obtain a phase map without anomalies. The image data is then phase-corrected by the phase correcting means using this phase map.

The invention from another aspect for resolving the above problems is a phase correction apparatus, comprising a filtering means which lowpass filters an image obtained by magnetic resonance imaging, phase distribution calculating means which calculates a phase distribution based on the lowpass filtered image, phase correcting means which phase corrects the image before lowpass filtering based on the calculated phase distribution, and control means which lowpass filters the phase-corrected image again by the filtering means, calculates a new phase distribution by the phase distribution calculating means based on the new lowpass filtered image, and phase-corrects the phase-corrected image again by the phase correcting means based on the new calculated phase distribution.

In the invention from this aspect, a first phase map is calculated from the lowpass filtered image by the phase distribution calculating means, the image before lowpass filtering is phase-corrected based on this phase map by the phase correcting means, the phase-corrected image is lowpass filtered again, a second phase map is calculated from this image by the phase distribution calculating means, and the image which was phase-corrected by the first phase map is then phase-corrected by the second phase map, by the phase correcting means. By performing plural phase corrections in this way, a phase correction comprising high-order components is performed. The image data is then phase-corrected by the phase correcting means using this phase map.

The invention from another aspect for resolving the above problems is a magnetic resonance imaging apparatus, comprising an imaging means which acquires an image of an imaging object using magnetic resonance, a filtering means which lowpass filters the image obtained by magnetic resonance imaging, a pixel position detecting means which detects pixel positions for which the ratio of a value after lowpass filtering to a value before lowpass filtering does not exceed a predetermined ratio by comparing pixel data for each corresponding pixel for the image before lowpass filtering and the image after lowpass filtering, a phase distribution calculating means which calculates a phase distribution based on the image before lowpass filtering or the image after lowpass filtering excluding pixel data at the detected pixel positions, a phase compensating means which compensates by estimating the phase at the excluded pixel positions in the calculated phase distribution from the phase at neighboring pixel positions, a phase correcting means which performs a phase correction of the image using the compensated phase distribution, and an image generating means which generates a water image and a lipid image separately using a phase difference of pixel data of the phase-corrected image.

In the invention from this aspect, pixel data for each corresponding pixel are compared for an image before and after lowpass filtering by the pixel position detecting means to detect pixel positions where there is a phase disturbance, a phase map is calculated excluding pixel data at these pixel positions by the phase distribution calculating means, and compensation is made by a phase compensating means which estimates the phase at the excluded pixel positions from the phase at neighboring pixel positions so as to obtain a phase map without anomalies. The image data is phase-corrected by the phase correcting means using this phase map. Water and lipids are imaged separately by the image generating means based on the phase-corrected image data.

The invention from another aspect for resolving the above problems is a magnetic resonance imaging apparatus, comprising an imaging means which acquires an image of an imaging object using magnetic resonance, a filtering means which lowpass filters the image obtained by magnetic resonance imaging, a phase distribution calculating means which calculates a phase distribution based on the lowpass filtered image, a phase correcting means which phase-corrects the image before lowpass filtering based on the calculated phase distribution, a control means which lowpass filters the phase-corrected image again by the filtering means, calculates a new phase distribution by the phase distribution calculating means based on the new lowpass filtered image, and phase-corrects the phase-corrected image again by the phase correcting means based on the new calculated phase distribution, and an image generating means which generates a water image and a lipid image separately using a phase difference of pixel data of the phase-corrected image.

In the invention from this aspect, a first phase map is calculated from a lowpass filtered image by the phase distribution calculating means, the image before lowpass filtering is phase-corrected based on this phase map by the phase correcting means, the phase-corrected image is lowpass filtered again, a second phase map is calculated from this image by the phase distribution calculating means, and the image which was phase-corrected by the first phase map is then phase-corrected by the second phase map, by the phase correcting means. By performing phase correction plural times in this way, a phase correction comprising high-order components is performed. The image data is phase-corrected by the phase correcting means using this phase map. Water and lipids are imaged separately by the image generating means based on the phase-corrected image data.

The invention from another aspect for resolving the above problems is a magnetic resonance imaging method, comprising the steps of taking an image of an imaging object using magnetic resonance, lowpass filtering the image obtained by magnetic resonance imaging, detecting pixel positions for which the ratio of a value after lowpass filtering to a value before lowpass filtering does not exceed a predetermined ratio by comparing pixel data for each corresponding pixel for an image before lowpass filtering and an image after lowpass filtering, calculating a phase distribution based on the image before lowpass filtering or the image after lowpass filtering excluding pixel data at the detected pixel positions, compensating by estimating the phase at the excluded pixel positions in the calculated phase distribution from the phase at neighboring pixel positions, performing phase correction of the image using the compensated phase distribution, and separately generating a water image and a lipid image using the phase difference of pixel data for the phase-corrected image.

In the invention from this aspect, pixel data for each corresponding pixel are compared for an image before and after lowpass filtering to detect pixel positions where there is a phase disturbance, a phase map is calculated excluding pixel data at these pixel positions, and compensation is made by estimating the phase at the excluded pixel positions from the phase at neighboring pixel positions so as to obtain a phase map without anomalies. The image data is phase-corrected using this phase map. Water and lipids are imaged separately based on the phase-corrected image data.

The invention from another aspect for resolving the above problems is a magnetic resonance imaging method, comprising the steps of taking an image of an imaging object using magnetic resonance, lowpass filtering the image obtained by magnetic resonance imaging, calculating a phase distribution based on the lowpass filtered image, phase-correcting the image before lowpass filtering based on the calculated phase distribution, lowpass filtering the phase-corrected image again, calculating a new phase distribution based on the new lowpass filtered image, phase-correcting the phase-corrected image again based on the new calculated phase distribution, and generating a water image and a lipid image separately using a phase difference of pixel data of the phase-corrected image.

In the invention from this aspect, a first phase map is calculated from the lowpass filtered image, the image before lowpass filtering is phase-corrected based on this phase map, the phase-corrected image is lowpass filtered again, a second phase map is calculated from this image, and the image which was phase-corrected by the first phase map is then phase-corrected by the second phase map. By performing phase correction plural times in this way, a phase correction comprising high-order components is performed. The image data is phase-corrected by the phase correcting means using this phase map. Water and lipids are imaged separately by the image generating means based on the phase-corrected image data.

According to this invention, a phase distribution measuring method and apparatus which calculates a precise phase map even when there is a local phase disturbance, a phase correction method and apparatus using this calculated phase map, and a magnetic resonance imaging apparatus which performs this phase correction can be provided.

This invention also provides a phase correction method and apparatus which allow easy phase correction comprising also high frequency components, and a magnetic resonance imaging apparatus which performs such a phase correction, a phase distribution measuring method and apparatus which calculate a precise phase map with high performance, a phase correction method and apparatus using this calculated phase map, and a magnetic resonance imaging apparatus which performs this phase correction.

Further objects and advantages of the present invention will be apparent from the following description of the preferred embodiments of the invention as illustrated in the accompanying drawings.

BRIEF DESCRIPTION OF THE DRAWINGS

FIGS. 4(A)–4(E) are a diagram showing an example of a pulse sequence executed by the apparatus shown in FIG. 2 or FIG. 3.

FIGS. 17(A) and 17(B) are a diagram describing the function of the data processing unit shown in FIG. 16.

DETAILED DESCRIPTION OF THE INVENTION

Figure 1A:
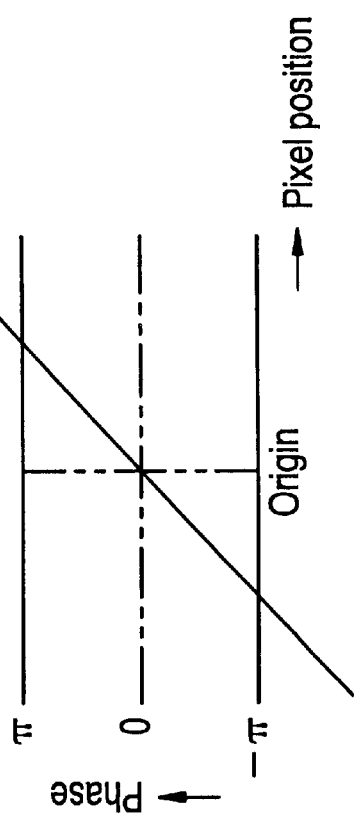
FIGS. 1(A) and 1(B) are a conceptual diagram of a phase map.
Figure 1B:
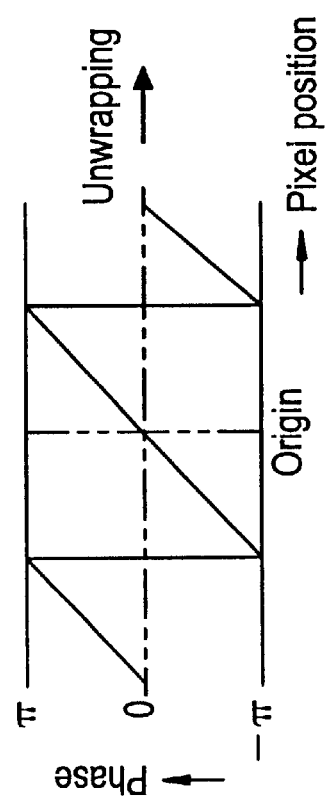
Figure 2:
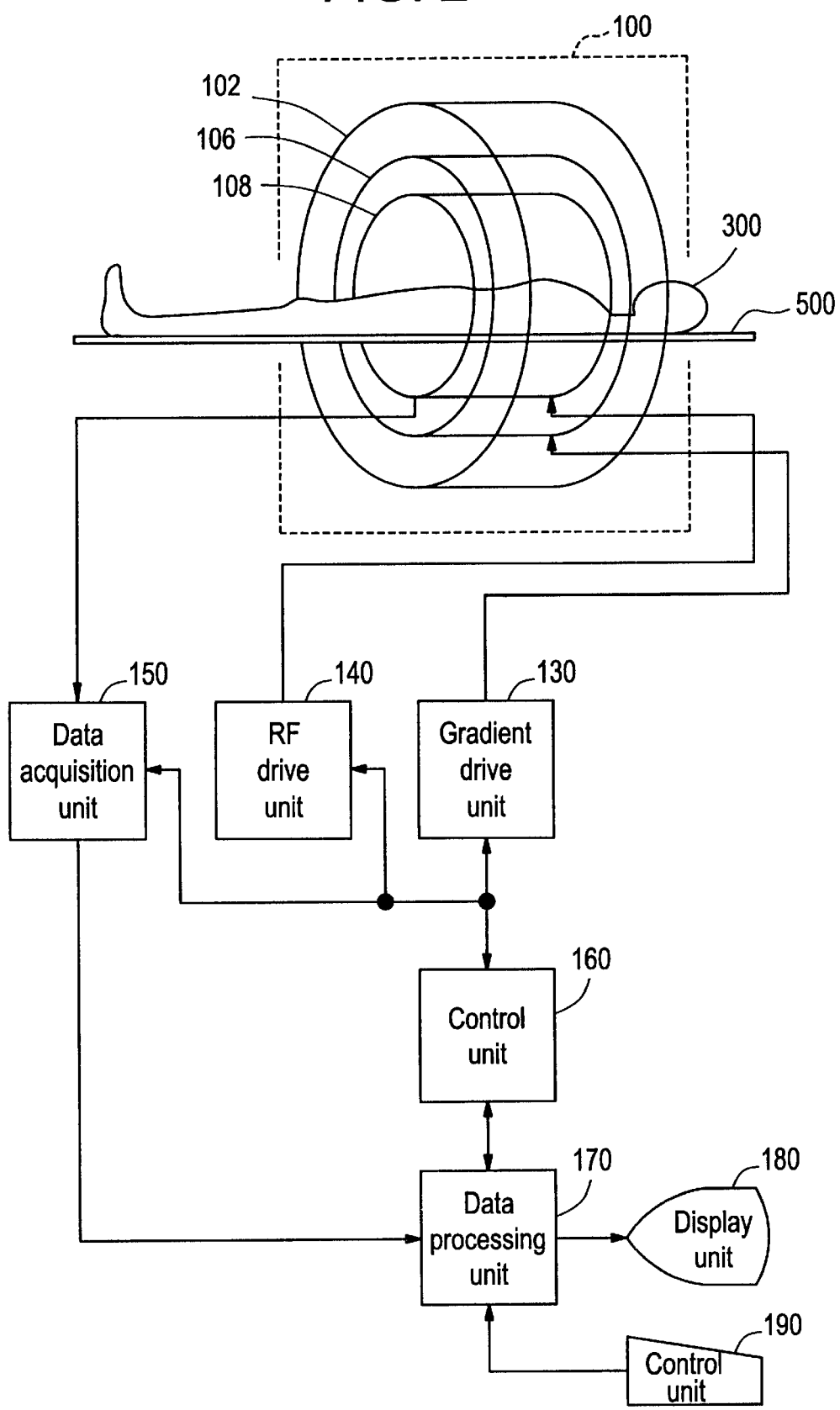
FIG. 2 is a block diagram of an apparatus according to one embodiment of this invention.

Some embodiments of this invention will now be described in detail referring to the drawings. A block diagram of a magnetic resonance imaging apparatus is shown in FIG. 2. This apparatus is an example of one embodiment of this invention. An embodiment relating to the apparatus of this invention is shown by the construction of this apparatus. An embodiment relating to the method of this invention is shown by the operation of this apparatus.

As shown in FIG. 2, this apparatus comprises a magnet system 100. The magnet system 100 comprises a magnetic field coil unit 102, gradient coil unit 106, and RF (radio frequency) coil unit 108. Each of these coil units have an essentially cylindrical shape, and are arranged coaxially with each other. An imaging object 300 is mounted on a cradle 500, and is transported in and out of the space inside the magnet system 100 by a transport system, not shown.

A main magnetic field coil unit 102 forms a stationary magnetic field in the internal space of the magnet system 100. The direction of the stationary magnetic field is essentially parallel to the axis of the imaging object 300, i.e., a so-called horizontal magnetic field is formed. The main magnetic field coil unit 102 is constructed of, for example, a superconducting coil. It is understood however that it is not limited to a superconducting coil, and may be constructed also of an ordinary conducting coil or the like.

A gradient coil unit 106 generates a gradient magnetic field for applying a gradient to the stationary magnetic field intensity. There are three types of gradient magnetic field generated, i.e., a slice gradient magnetic field, a read-out gradient magnetic field and a phase encode gradient magnetic field, and the gradient coil unit 106 comprises three systems of gradient coils, not shown, corresponding to these three types of gradient magnetic fields.

The RF coil unit 108 forms a high frequency magnetic field for exciting the spin inside the imaging object 300 in the stationary magnetic field space. Hereafter, the forming of the high frequency magnetic field will be referred to as the sending of a RF excitation signal. The RF coil unit also 108 receives an electromagnetic wave, i.e., a magnetic resonance signal, generated by the excited spin. The RF coil unit 108 comprises a sending coil, not shown, and a receiving coil, not shown. The same coil may be used for the sending and receiving coils, or dedicated coils may be used for each.

A gradient drive unit 130 is connected to the gradient coil unit 106. The gradient drive unit 130 supplies a drive signal to the gradient coil unit 106 to generate the gradient magnetic field. The gradient drive unit 130 comprises three drive circuits, not shown, corresponding to the three gradient coils in the gradient coil unit 106.

An RF drive unit 140 is connected to the RF coil unit 108. The RF drive unit 140 supplies a drive signal to the RF coil unit 108, transmits an RF excitation signal, and excites the spin inside the imaging object 300.

A data acquisition unit 150 is connected to the RF coil unit 108. The data acquisition unit 150 acquires a signal received by the RF coil unit 108, and collects it as digital data.

A control unit 160 is connected to the gradient drive unit 130, RF drive unit 140 and data acquisition unit 150. The control unit 160 respectively controls the gradient drive unit 130 or the data acquisition unit 150, respectively.

The output side of the data acquisition unit 150 is connected to a data processing unit 170. The data processing unit 170 stores data acquired from the data acquisition unit 150 in a memory, not shown. A data space is formed in the memory. The data space comprises a two-dimensional Fourier space. The data processing unit 170 transforms data in this two-dimensional Fourier space so as to reconstitute the image of the imaging object 300.

The data processing unit 170 is connected to the control unit 160. The data processing unit 170 is above the control unit 160, and controls it. A display unit 180 and an operating unit 190 are connected to the data processing unit 170. The display unit 180 displays the reconstituted image and various kinds of information which are output from the data processing unit 170. The operating unit 190 is operated by operating personnel, and inputs various kinds of commands, information, etc. into the data processing unit 170.

Figure 3:
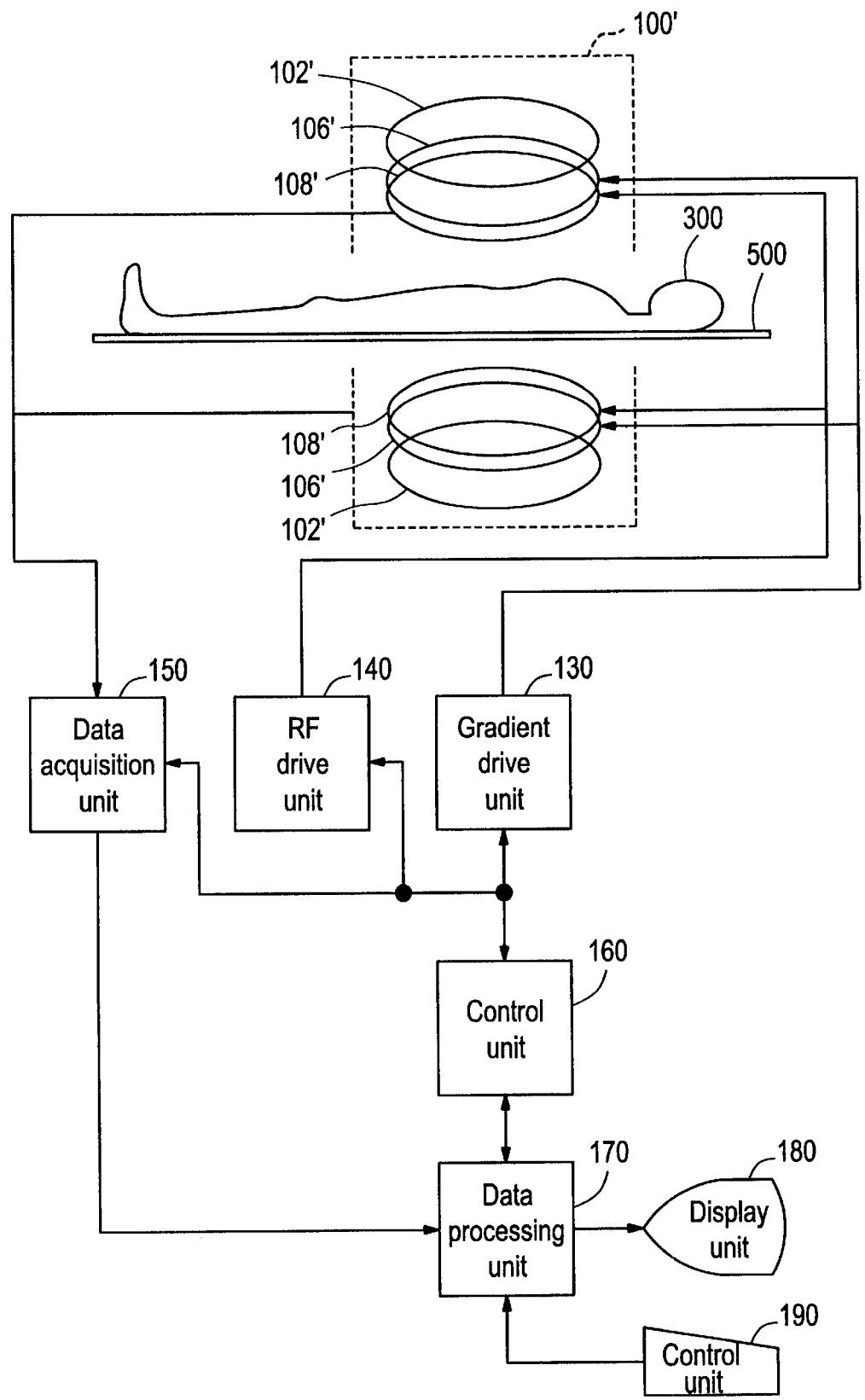
FIG. 3 a block diagram of an apparatus according to one embodiment of this invention.

A block diagram of the magnetic resonance imaging apparatus is shown in FIG. 3. This apparatus is an example of one embodiment of this invention. An embodiment relating to the apparatus of this invention is shown by the construction of this apparatus. An embodiment relating to the method of this invention is shown by the operation of this apparatus.

The apparatus shown in FIG. 3 comprises a magnet system 100' different from the apparatus shown in FIG. 2. Apart from the magnet system 100', it has the same structure as the apparatus shown in FIG. 2. Identical symbols are given to identical parts, and their explanation is omitted.

The magnet system 100' comprises a main magnetic field magnet unit 102', gradient coil unit 106' and RF coil unit 108'. These main magnetic field magnet units 102' and coil units each comprise a pair facing each other across a gap. They also have a substantially disk-like shape,.and are arranged to share a common axis. The imaging object 300 is mounted on a cradle 500, and is transported in and out of the internal space of the magnet system 100' by a transport means, not shown.

The main magnetic field magnet unit 02' forms a stationary magnetic field in the internal space of the magnet system 100'. The direction of the stationary magnetic field is essentially perpendicular to the axial direction of the imaging object 300, i.e., a so-called orthogonal magnetic field is formed. The main magnetic field magnet unit 102' for example comprises a permanent magnet, etc., but is of course not limited to a permanent magnet and may also comprise a superconducting electromagnet or ordinary conducting electromagnet, etc.

The gradient coil unit 106' generates a gradient magnetic field for giving a gradient to the stationary magnetic field intensity. There are three types of gradient magnetic field generated, and the gradient coil unit 106' comprises three systems of gradient coils, not shown, corresponding to these three types of gradient magnetic fields.

The RF coil unit 108' sends an RF excitation signal for exciting the spin inside the imaging object 300 in the stationary magnetic field space. The RF coil unit 108' also receives a magnetic resonance signal generated by the excited spin. The RF coil unit 108' comprises a sending coil, not shown, and a receiving coil, not shown. The same coil may be used for the sending and receiving coils, or dedicated coils may be used for each.

An example of a pulse sequence used for magnetic resonance imaging is shown in FIGS. 4(A) 4(E). This pulse sequence is a pulse sequence of the spin echo (SE: Spin Echo) method.

Specifically, FIG. 4(A) is the sequence of a 90 degree pulse and 180 degree pulse for RF excitation in the SE method, and likewise, FIGS. 4(B)–4(E) respectively are the sequences of a slice gradient Gs, read-out gradient Gr, phase encode gradient Gp and spin echo MR respectively. The 90 degree pulse and 180 degree pulse are respectively represented by main signals. The pulse sequence advances from left to right along the time axis t.

As can be seen from this figure, a 90 degree spin excitation is performed by the 90 degree pulse. At this time, the slice gradient Gs is applied, and selective excitation occurs for a predetermined slice. After a predetermined time from 90 degree excitation, 180 degree excitation, i.e. spin inversion, takes place due to the 180 degree pulse. The slice gradient Gs is also applied here, and selective inversion occurs for the same slice.

During the interval between 90 degree excitation and spin inversion, the read-out gradient Gr and the phase encode gradient Gp are applied. Due to the read-out gradient Gr, dephase takes place. Due to the phase encode gradient Gp, phase encode takes place.

After spin inversion, the spin is rephased by the read-out gradient Gr, and the spin echo MR is generated. The spin echoes MR are collected by the data acquisition unit 150 as view data. The pulse sequence is repeated 64 to 512 times in a period TR (repetition time). The phase encode gradient Gp is varied at each repeat, and a different phase encode is performed each time. In this way, 64 to 512 view data are obtained.

The spin echo MR is an RF signal which has a symmetrical waveform with respect to the echo center. The main echo is produced after a TE (echo time) from the 90 degree excitation. By suitably choosing TE, the phase difference of the water echo and the lipid echo can be made π/2. When the stationary magnetic field intensity is 0.2T, the TE which makes the phase difference π/2 is of the order of 2τ+8.6 ms or 2τ−8.6 ms. τ is the time interval from 90 degree excitation to 180 degree excitation. The spin echo obtained from a TE of this order has a sufficient signal intensity.

Another example of the pulse sequence for magnetic resonance imaging is shown in FIGS. 5(A)–5(E). This pulse sequence is a pulse sequence of the gradient echo (GRE: Gradient Echo) method.

Figure 5A:
Figure 5B:
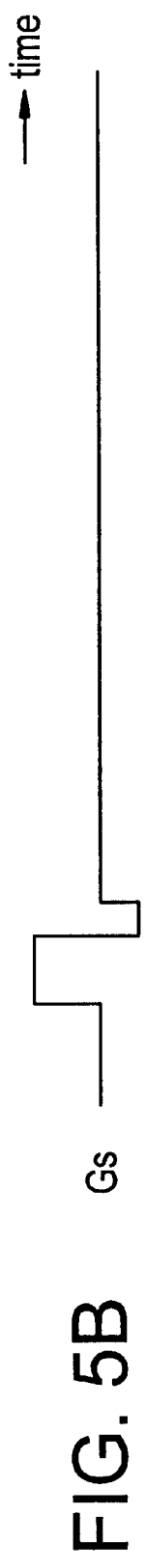
Figure 5C:
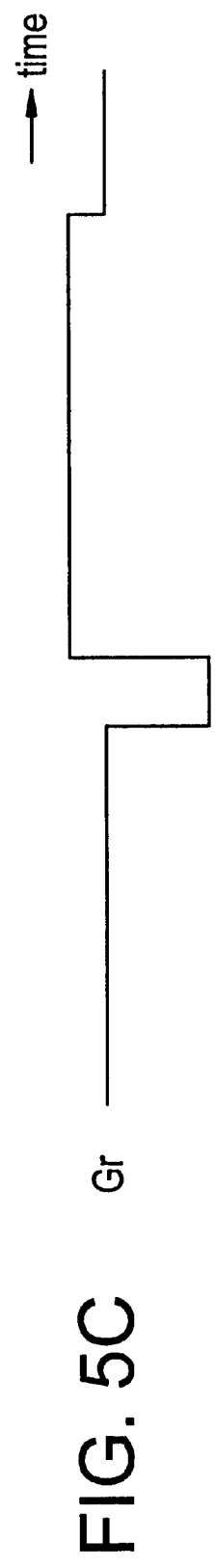
Figure 5D:
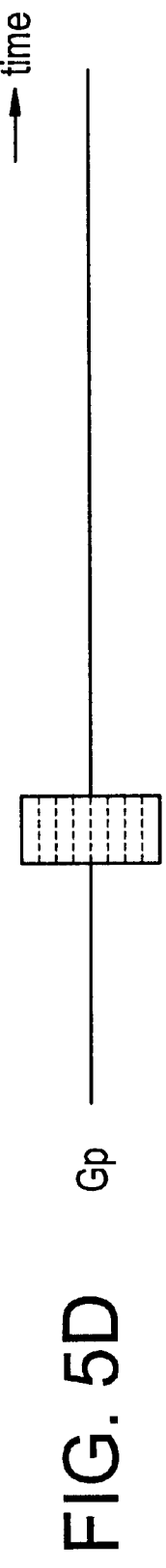
Figure 5E:
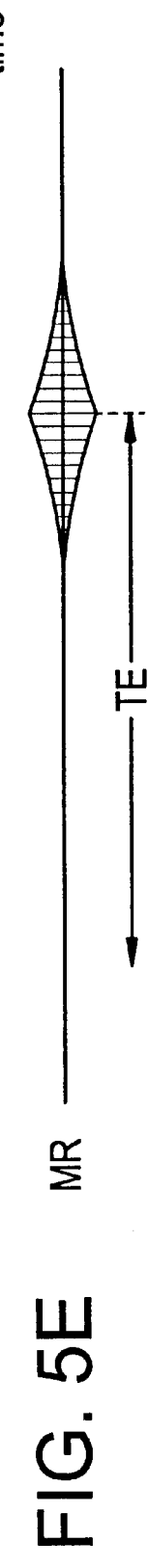

Specifically, FIG. 5(A) is a degree pulse sequence for RF excitation in the GRE method, and likewise, FIGS. 5(A)–5(E) respectively are slice gradient Gs, read-out gradient Gr, phase encode gradient Gp and spin echo MR sequences respectively. The α degree pulse is represented by the main signal. The pulse sequence advances from left to right along the time axis t.

As shown in this figure, a degree excitation of the spin takes place due to the a degree pulse. α is 90 degrees or less. At this time, the slice gradient Gs is applied and selective excitation of a predetermined slice occurs.

After α degree excitation, phase encode of the spin is performed by the phase encode gradient Gp. Next, the spin is first dephased by the read-out gradient Gr, then the spin is rephrased, and the gradient echo MR is generated. Gradient echoes MR are collected by the data acquisition unit 150 as view data. This pulse sequence is repeated 64 to 512 times in the period TR. The phase encode gradient Gp is varied at each repeat, and a different phase encode is performed each time. In this way, 64 to 512 view data are obtained.

The gradient echo MR is an RF signal which has a symmetrical waveform relative to the echo center. The main echo is generated after TE from a degree excitation. By suitably choosing the time TE, the phase difference of the water echo and the lipid echo can be made π/2. In the case where the stationary magnetic field intensity is 0.2T, the TE which makes the phase difference π/2 is of the order of 8.6 ms. The gradient echo obtained by a TE of this order has sufficient signal intensity.

The view data collected by the pulse sequence of FIG. 4 or FIG. 5 are collected by the memory of the data processing unit 170. It will of course be understood that the pulse sequence is not restricted to the SE method or GRE method, and may consist of other suitable techniques such as the fast spin echo (FSE: Fast Spin Echo) method or echo planar imaging (EPI: Echo Planar Imaging) method.

The data processing unit 170 applies a two-dimensional inverse Fourier transformation of the view data so as to reconstruct a tomogram of the imaging object 300. The reconstructed image is stored in memory. The structure and function of the apparatus so far are an example of one embodiment of the imaging means according to this invention.

From the reconstructed image, the data processing unit 170 respectively generates an image of the water part, and an image of the lipid part. Hereafter, the image of the water part will be referred to as a water image, and the image of the lipid part will be referred to as a lipid part.

In generating the water image and lipid image, the data processing unit 170 calculates a phase distribution, i.e. a phase map, corresponding to the intensity distribution of the stationary magnetic field. It will of course be understood that the phase map may be used not only for water and lipid separation, but also for phase correction in ordinary imaging.

The data processing unit 170 is an example of one embodiment of the phase distribution measuring apparatus of this invention. An embodiment relating to the apparatus of this invention is shown by the construction of the data processing unit 170. An embodiment relating to the method of this invention is shown by the operation of the data processing unit 170.

The data processing unit 170 performs a phase correction which removes the effect of the non-uniformity of the magnetic field using a phase map. The data processing unit 170 is an example of one embodiment of the phase correcting apparatus of this invention. An embodiment relating to the apparatus of this invention is shown by the construction of the data processing unit 170. An embodiment relating to the method of this invention is shown by the operation of the data processing unit 170. The data processing unit 170 is also an example of one embodiment of the phase correction means according to this invention.

Figure 6:
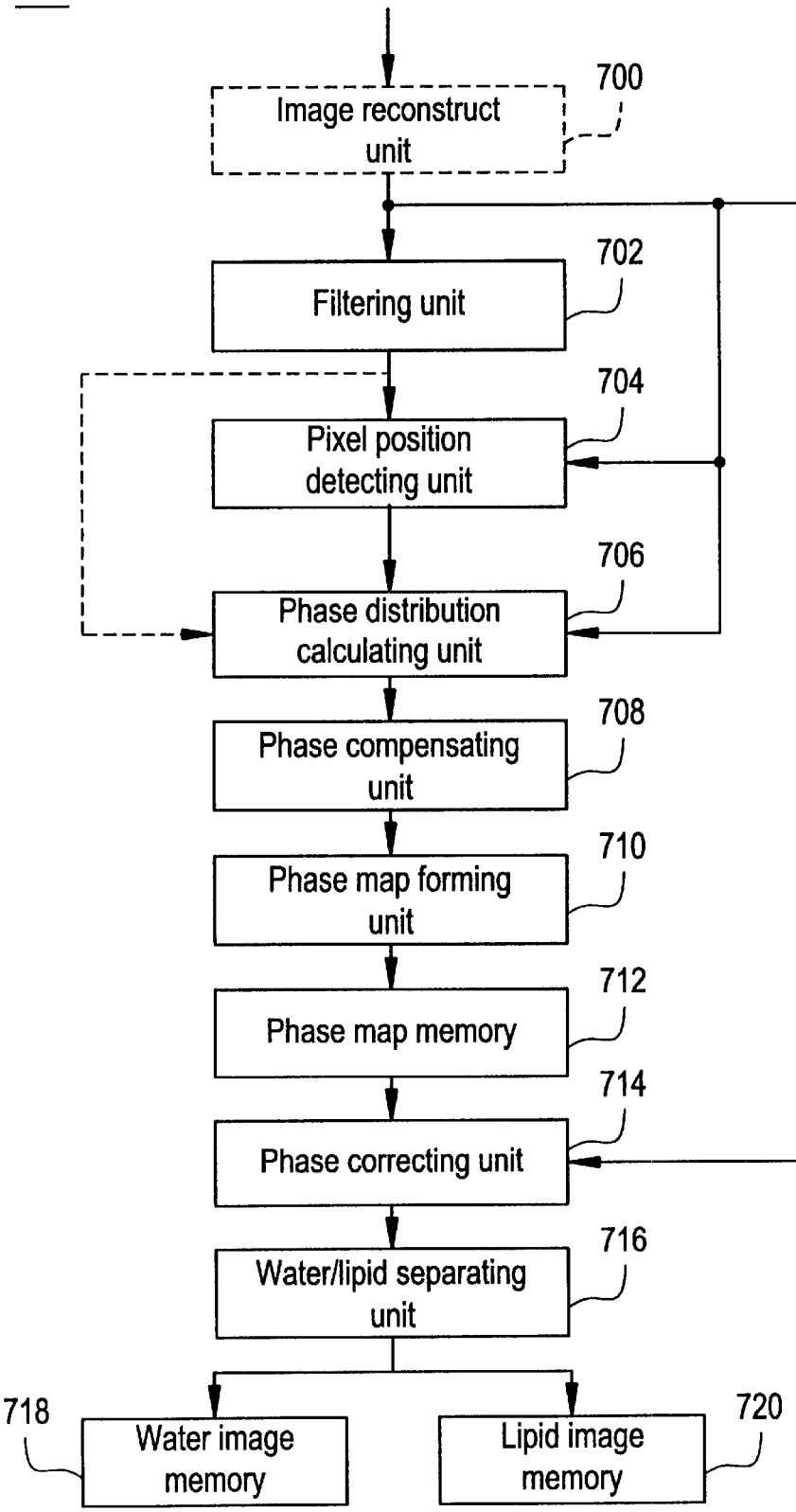
FIG. 6 is a block diagram of a data processing unit in the apparatus shown in FIG. 2 or FIG. 3.

FIG. 6 is a block diagram of the data processing unit 170 seen from the viewpoint of separately generating the water image and lipid image. The function of each block of this diagram may be realized for example by a computer program or the like. This is the same hereafter.

As can be seen from this figure, the data processing unit 170 comprises a filtering unit 702. The filtering unit 702 is an example of one embodiment of the filtering means according to this invention. The reconstituted image is input to the filtering unit 702 from an image reconstituting unit 700 of the preceding stage. The reconstituted image may for example be an image obtained by imaging a standard phantom. The standard phantom contains only a water component.

The pixel data of the reconstituted image is given by complex numbers. Specifically, the pixel data comprises a real number component and an imaginary number component. Hereafter, the real number component and imaginary number component will respectively be referred to as a real part and an imaginary part.

Figure 7:
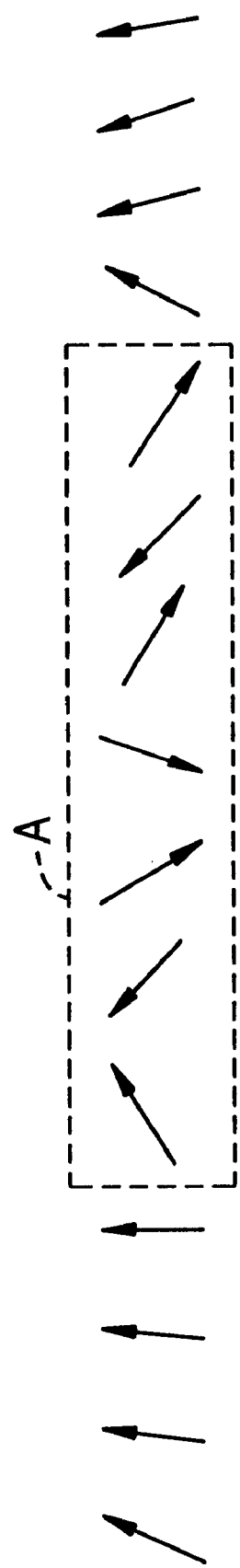
FIG. 7 is a diagram describing the function of the data processing unit shown in FIG. 6.

In the input image, due to reasons other than nonuniformity of the magnetic field resulting from variation in the magnetization of the imaging object, phase variation due to lipids, ghosting or large noise due to blood flow and body movement, or a combination of these factors, when the phase of the pixel data is locally disturbed, the vectors representing complex image data may have various phases as shown for example in region A of FIG. 7. FIG. 7 is a one-dimensional sequence of pixel data. To simplify this description, it will be assumed that the signal intensity of the pixel data is constant.

This input image is subjected to lowpass filtering in the filtering unit 702. Lowpass filtering is performed by, for example, a moving average. A suitable weighting such as for example a Gaussian distribution may be applied to pixel data added to the moving average.

Figure 8:
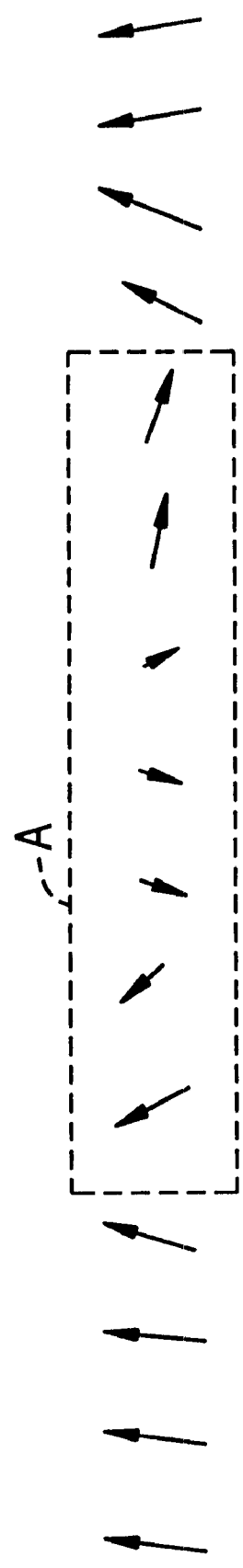
FIG. 8 is a diagram describing the function of the data processing unit shown in FIG. 6.

Due to the lowpass filtering, pixel data is given as the average of a predetermined number of adjacent pixel data on either side, so each of the pixel data will be as shown for example in FIG. 8. Specifically, in the region A, the phases of pixel data are largely different from those of surrounding pixel data, so the signal intensity drops considerably due to the moving average. Outside the region A, there is not such a difference in practice except for immediately neighboring pixel data.

Regarding these pixel data, pixel positions for which the amplitude has decreased are detected by a pixel position detecting unit 704. The pixel position detecting unit 704 is one embodiment of the pixel position detecting means according to this invention. When pixel positions are detected, the input image is also looked up. The detection of pixel positions is performed by detecting pixel positions for which the conditions of the following equations are satisfied:

$$\frac{\text{Signal intensity before filtering}}{\text{Signal intensity after filtering}} \geq E \quad (1)$$

Or, $\frac{\text{Signal intensity after filtering}}{\text{Signal intensity before filtering}} \leq e$ (2)

where E, e are threshold values.

Using the above equations, corresponding pixels are compared for pixel data in the image before filtering and the image after filtering, and pixel positions for which the signal intensity decrease exceeds a predetermined limit are detected. As a result, the pixel positions belonging to the region A, i.e,, pixel positions where there is a phase disturbance, can be detected.

The threshold values E, e are determined as statistical values based on, for example, the standard deviation of values of Eqn. (1) or (2) for all pixel data. Alternatively, they are values determined based on past experience. Still again, they may be suitably adjusted in the light of the results.

The pixel position information thus detected is input to a phase distribution calculating unit 706. The input image is also input to the phase distribution calculating unit 706. The image input to the phase distribution calculating unit 706 may be the output image of the filtering unit 702. The phase distribution calculating unit 706 is one embodiment of the phase distribution calculating means according to this invention.

The phase distribution calculating unit 706 calculates the phase for each pixel data in the input image. The phases are found by calculating an arc tangent of the real part and the imaginary part of complex image data. In this process, the calculation is performed excluding the aforesaid pixel positions. In this way, a phase distribution is obtained without data for those pixel positions where there is a phase disturbance.

Regarding this phase distribution, a phase correction is performed for parts where there is no phase data by a phase compensating unit 708. The phase compensating unit 708 is one embodiment of the phase compensating means according to this invention. The phase compensation is performed by interpolation method. The interpolation method may be interpolation or phase interpolation. For the interpolation calculation, a first order function, a higher order function or a spline function may be used depending on convenience.

In this way, a phase distribution in which the data has been completed, is obtained. Based on this phase distribution, a phase map is formed by a phase map forming unit 710. When the phase map is formed, phase unwrapping is performed. As the phase disturbances in the phase distribution have been eliminated, the unwrapping can be performed precisely, and a correct phase map can be obtained.

The phase map is stored in a phase map memory 712. The phase map stored in the phase map memory 712 is used for phase correction of the reconstituted image in a phase correcting unit 714. The phase correcting unit 714 inputs the reconstituted from the image reconstituting unit 700 to perform the phase correction. The phase of this pixel data is corrected by the phases of corresponding pixels in the phase map.

The complex image in which the phase has been corrected is input to a water/lipid separating unit 716. The water/lipid separating unit 716 is one embodiment of the image generating means according to this invention. The water/lipid separating unit 716 generates a water image using the real part, and generates a lipid image using the imaginary part, of the phase-corrected complex image. In this way, a precise water image and lipid image can be obtained. The generated water image is stored in a water image memory 718, and the lipid image is stored in a lipid image memory 720.

Figure 9:
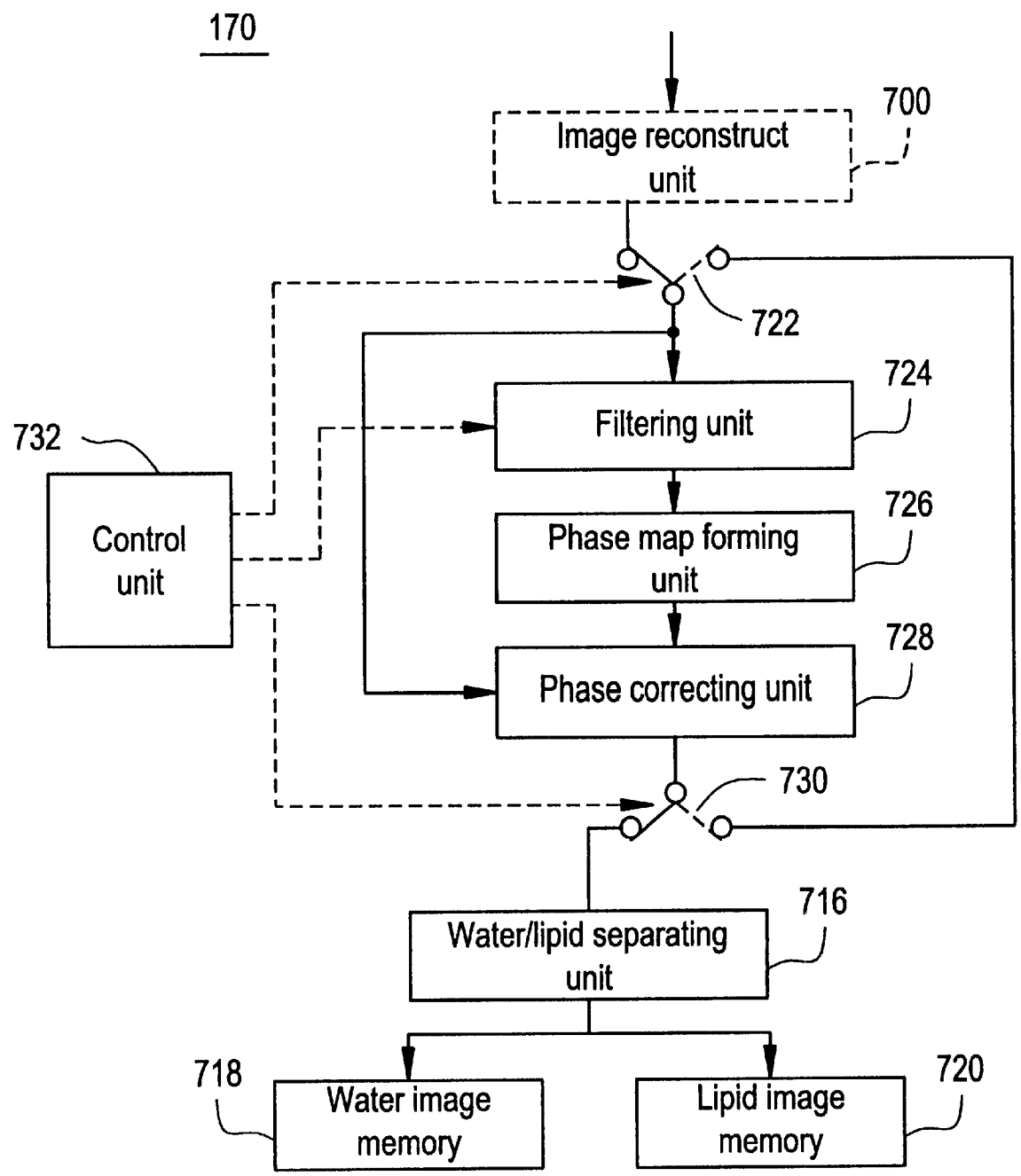
FIG. 9 is a block diagram of the data processing unit in the apparatus shown in FIG. 2 or FIG. 3.

FIG. 9 shows another block diagram of the data processing unit 170 from the viewpoint of generating a separate water image and lipid image. The function of each block in this diagram is for example implemented by a computer program. If the stationary magnetic field non-uniformity is non-linear, the data processing unit 170 shown in this diagram performs a phase correction by a corresponding phase map comprising high order components. For simplicity, high order components and low order components of the phase map corresponding to the non-linearity of the stationary magnetic field non-uniformity will be referred to as high order phase and low order phase.

As shown in this diagram, the data processing unit 170 comprises a filtering unit 724. The filtering unit 724 is identical to the aforesaid filtering unit 702. The reconstituted image from the image reconstituting unit 700 or a phase-corrected image described later are input via a change-over unit 722 to the filtering unit 724. The change-over of the change-over unit 722 is controlled by a control unit 732.

The filtering unit 724 performs lowpass filtering on the input image. The filtering unit 724 is one embodiment of the filtering means according to this invention. The degree of lowpass filtering is adjusted by the control unit 732. The degree of lowpass filtering is also adjusted by a data number and weighting using the moving average. The controller 732 is one embodiment of the filtering adjustment means according to this invention.

Figure 10:
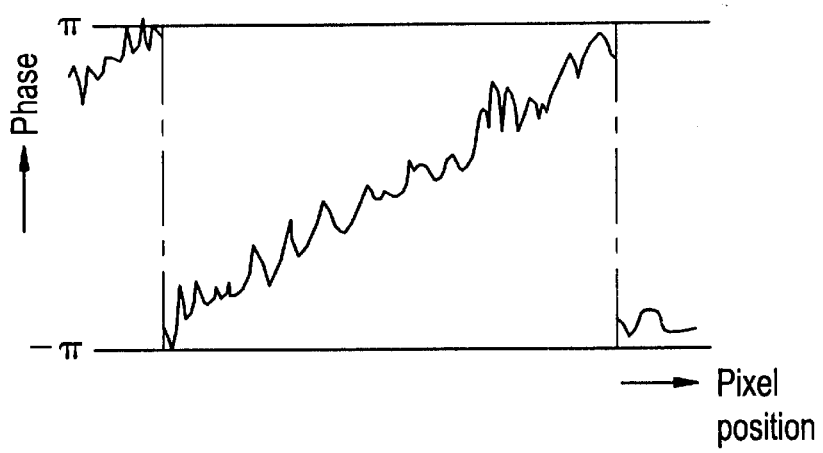
FIG. 10 is a diagram describing the function of the data processing unit shown in FIG. 9.
Figure 11:
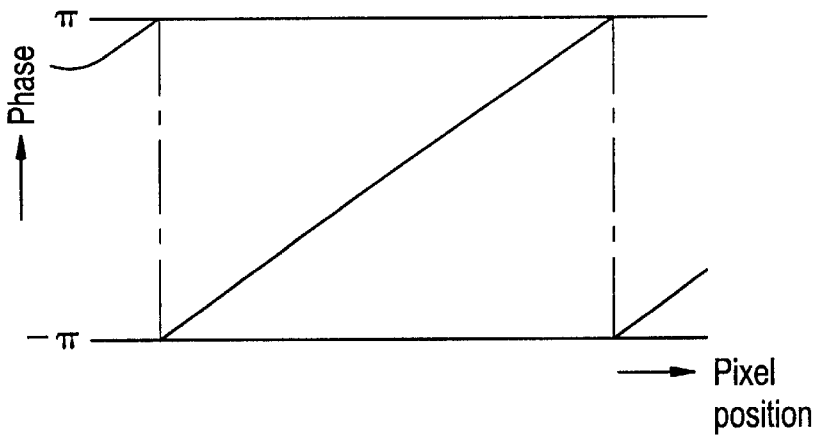
FIG. 11 is a diagram describing the function of the data processing unit shown in FIG. 9.

Due to this lowpass filtering, a phase distribution as shown for example in FIG. 10 or a smoothed phase distribution as shown in FIG. 10 is obtained in the reconstituted image. This phase distribution comprises only first order and neighboring low order phase, and does not comprise high order phase. In FIG. 10 and FIG. 11, the phase distribution is degenerated to first order for convenience of explanation. This is the same for the subsequent diagrams.

For the lowpass filtered, reconstituted image, a phase map is formed by a phase map forming unit 726. The construction from the pixel position detecting unit 704 to the phase compensating unit 708 shown in FIG. 5 may be built into the phase map forming unit 726, and the phase map formed after modifying the phase disturbance part.

The phase map forming unit 726 is one embodiment of the phase calculating means according to this invention. The phase map forming unit 726 is identical to the aforesaid phase map forming unit 710. When the phase map is formed, phase unwrapping is performed for wraparound parts.

Figure 12:
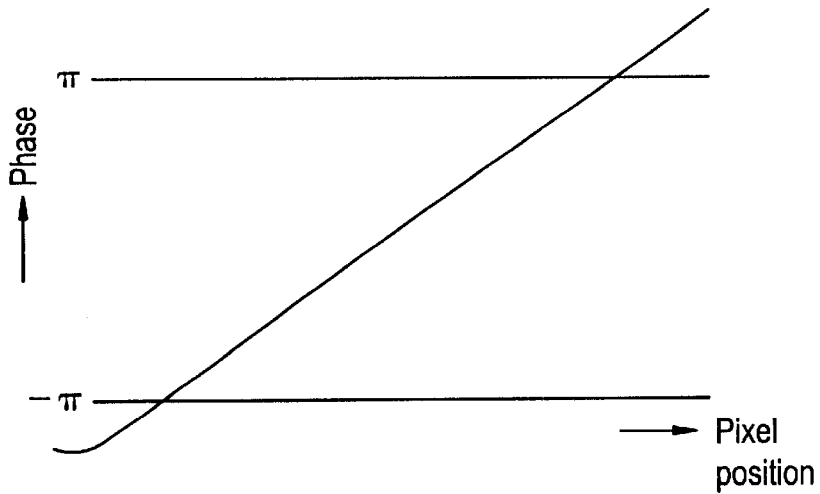
FIG. 12 is a diagram describing the function of the data processing unit shown in FIG. 9.

The phase distribution of the lowpass filtered image is as shown in FIG. 11, and a phase map as shown in FIG. 12 is thereby obtained. A phase correction of the input image by a phase correcting unit 728 is performed using this phase map. The phase correcting unit 728 is one embodiment of phase correcting means of this invention. The phase correcting unit 728 is identical to the aforesaid phase correcting unit 714.

Figure 13:
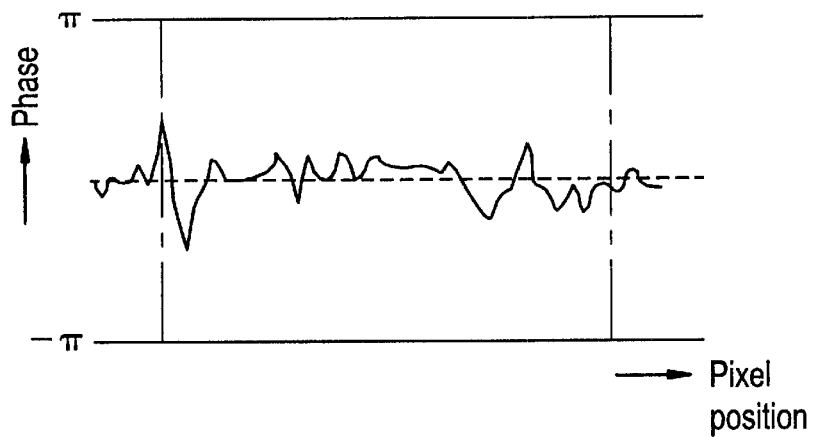
FIG. 13 is a diagram describing the function of the data processing unit shown in FIG. 9.

The phase distribution of the phase-corrected, input image is as shown for example in FIG. 13. As shown in this figure, first or low order phase in the input image is phase-corrected, leaving high order phase. The remaining high order phase contains high order phase due to the non-linearity of the stationary magnetic field.

The phase-corrected image having this phase distribution is returned to the filtering unit 724 via a change-over unit 730 and the change-over unit 722, where lowpass filtering is performed again. The degree of lowpass filtering is adjusted by the controller 732. The degree of lowpass filtering is arranged to be weaker than the degree of lowpass filtering on the immediately preceding occasion. The degree of lowpass filtering may weakened for example by eliminating some of the data from the moving average.

Figure 14:
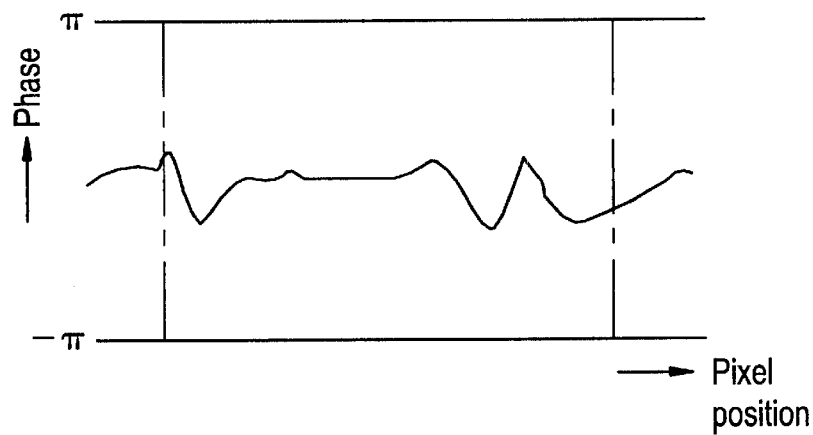
FIG. 14 is a diagram describing the function of the data processing unit shown in FIG. 9.

Due to this lowpass filtering, the phase distribution in the image, shown for example in FIG. 13, becomes as shown in FIG. 14. FIG. 14 comprises high order phase depending on the extent to which lowpass filtering was weakened.

From this lowpass filtered image, a phase map is formed by the phase map forming unit 726. The phase map so obtained is identical to that shown in FIG. 14. The image which has already been phase-corrected is now phase corrected again by the phase correcting unit 728 using this phase map.

Figure 15:
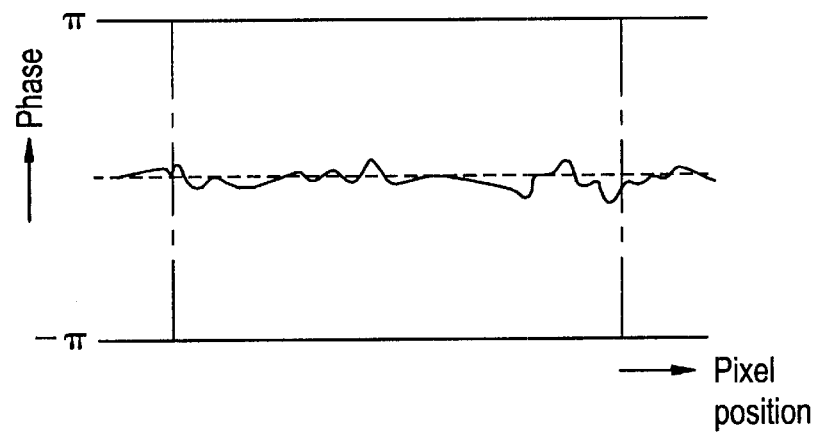
FIG. 15 is a diagram describing the function of the data processing unit shown in FIG. 9.

The phase distribution of the phase-corrected image has been phase-corrected for high order phase as shown for example in FIG. 15. In this way, high order phase due to the non-linearity of the stationary magnetic field can be corrected.

If the image is to be corrected also for remaining high order phase at this stage, the phase-corrected image is again returned to the filtering unit 724 via the change-over unit 722. The degree of the filtering unit 724 is further weakened, lowpass filtering is performed, and a third phase correction is performed using the phase map calculated from the filtered image. This processing is repeated a desired number of times. In other words, formation of the phase map and phase correction using this map are performed cyclically. The parts comprising the controller 732 and change-over units 722, 730 are one embodiment of the control means according to this invention.

On each occasion, the degree of lowpass filtering is progressively weakened. Conversely, the degree of lowpass filtering can initially be set weak, and progressively intensified on each occasion. To intensify the degree of lowpass filtering, the data number in the moving average may for example be increased. The degree of lowpass filtering may also be the same on each occasion.

The phase-corrected image may be displayed at any time during the above repeats. In this way, the extent of phase correction can be verified at any time, so a more suitable phase correction can then be performed.

Finally, the phase-corrected image is input to the water/lipid separating unit 716 via the change-over unit 730. The water/lipid separating unit 716 respectively forms a water image and a lipid image, and stores them in the water image memory 718 and lipid image memory 720. The phase correction is performed up to high order components, so a precise water image and lipid image can be obtained.

When an image of the imaging object 300 is used as the original image to calculate the phase map, the water image and lipid image have a phase difference of $\pi/2$ due to the above pulse sequence, so at a position corresponding to the lipid image, the phase map has a phase wherein $\pi/2$ is added to the phase due to the stationary magnetic field non-uniformity.

When a phase correction is performed using this phase map, even the phase difference of the water image and lipid image is corrected, so separate water/lipid images can no longer be obtained. The following processing is therefore performed when the phase map is calculated from an image acquired from the imaging object 300.

Figure 16:
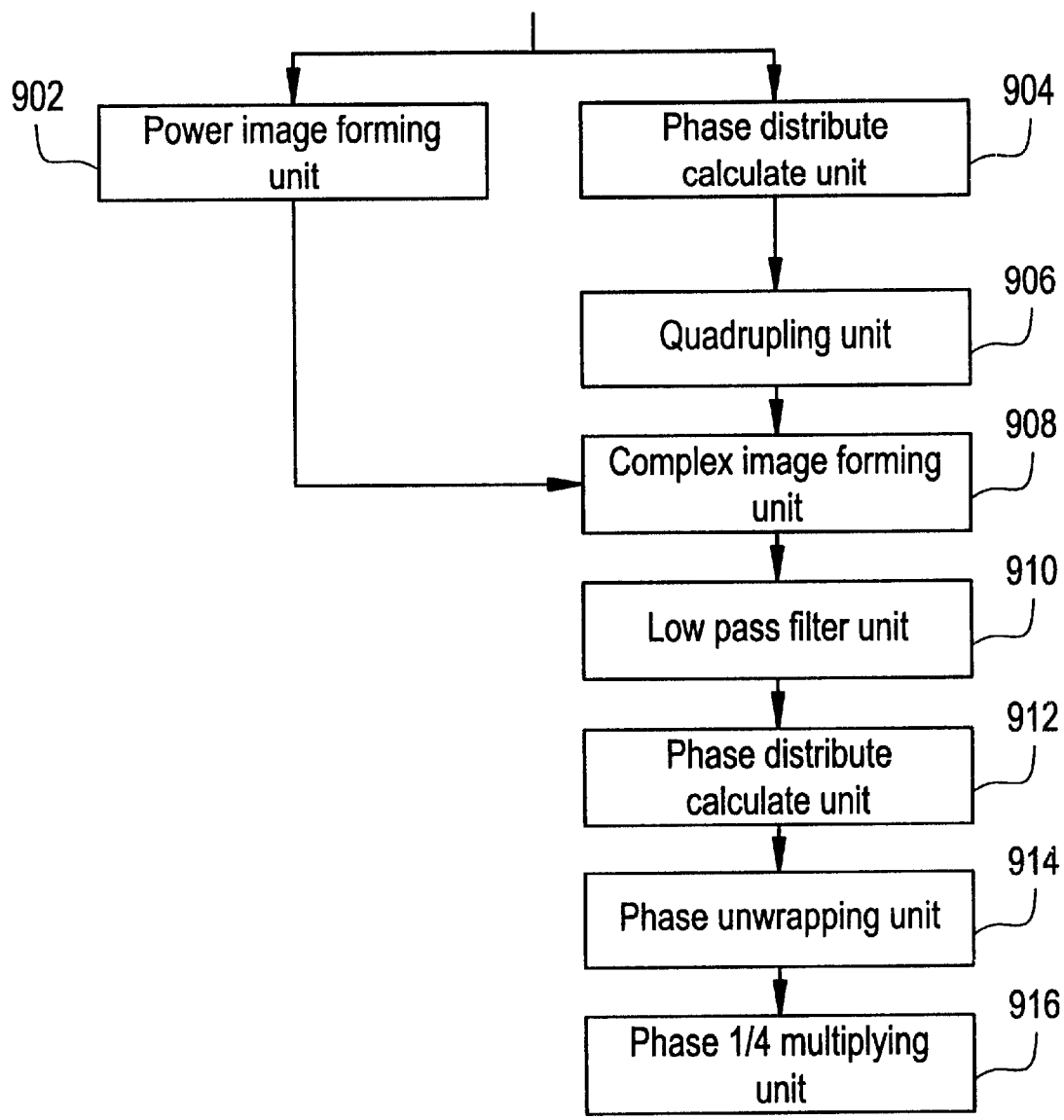
FIG. 16 is a block diagram of the data processing unit in the apparatus shown in FIG. 2 or FIG. 3.

FIG. 16 shows a block diagram of the data processing unit 170 from the viewpoint of calculating the phase map from an image wherein the water image and lipid image have a phase difference of $\pi/2$. As shown in this figure, the data processing unit 170 comprises a power image forming unit 902 and phase distribution calculating unit 904. The reconstituted image is input to the power image forming unit 902 and phase distribution calculating unit 904.

Figure 17A:
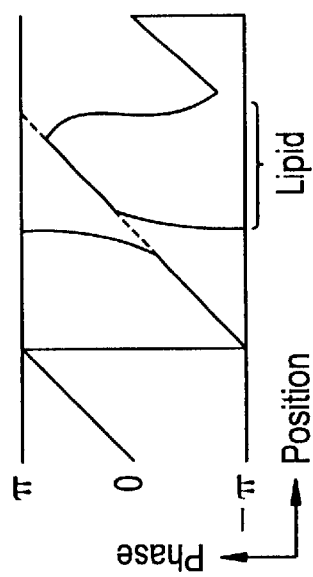
FIGS. 17(A) and 17(B) are a diagram showing an example of a pulse sequence executed by the apparatus shown in FIG. 2 or FIG. 3.

The power image forming unit 902 calculates the power of the complex number data for each pixel, and forms an image wherein this power is taken as the pixel value, i.e., a power image. The phase distribution calculating unit 904 calculates the phase distribution of the reconstituted image. A schematic view of the phase distribution is shown in FIG. 17(a). This figure shows the case where the phase distribution is a one-dimensional profile when the tomogram comprises a lipid image and a water image surrounding it.

If the stationary magnetic field is assumed to be uniform, as the phase of the water image is 0, so the one-dimensional profile of the phase distribution (referred to hereafter simply as phase distribution) would have a contour shown by the dot-and-dash line in the figure, but if the stationary magnetic field has a non-uniformity wherein it is linearly inclined, the phase distribution will be as shown by the solid line.

Figure 17B:
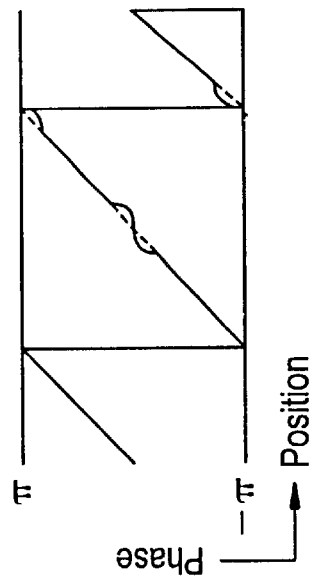

The phase distribution is input to a phase quadrupler 906. The phase quadrupler 906 quadruples each phase in the phase distribution. As a result, a phase distribution as shown in FIG. 17(b) is obtained. As shown in this figure, the phase difference between water and lipids becomes $2\pi$ due to quadrupling, so both have the same phase. It should be noted that wraparound occurs in the phase distribution, and at the boundary between water and lipids, a phase discontinuity or sharp change also occurs.

This phase distribution is input to the complex image forming unit 908. The power image from the power image forming unit 902 is also input to the complex image forming unit 908. The complex image forming unit 908 forms a complex image based on the phase distribution and the power image.

The real part of the complex image is calculated as the cosine of power image data. The imaginary part of the complex image is calculated as the sine of the power image data. The angle used for computing the cosine and sine is the phase angle.

Figure 18A:
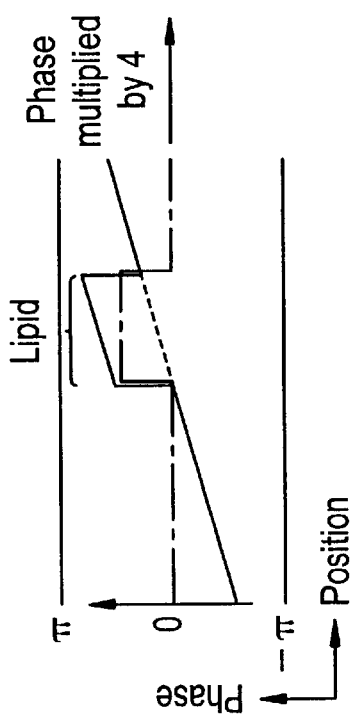
FIGS. 18(A) and 18(B) are a diagram describing the function of the data processing unit shown in FIG. 16.
Figure 18B:
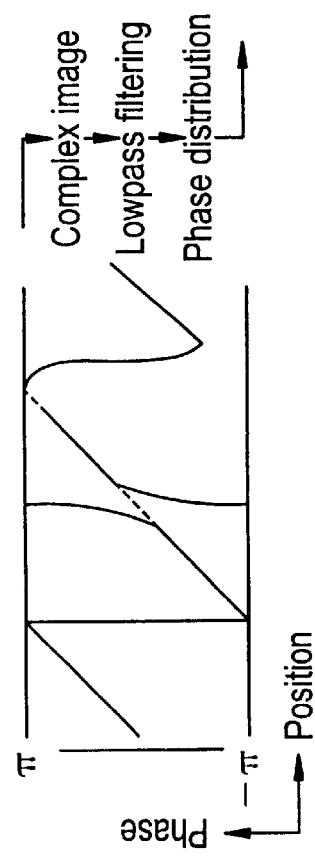

The complex image is input to a phase distribution calculating unit 912 via a lowpass filter unit 910. The phase distribution calculating unit 912 forms a phase distribution from the complex image subjected to lowpass filtering. Due to the lowpass filtering, the discontinuity or sudden change of phase in the phase distribution shown in FIG. 18(a) is smoothed out as shown for example in FIG. 18(b).

Figure 19A:
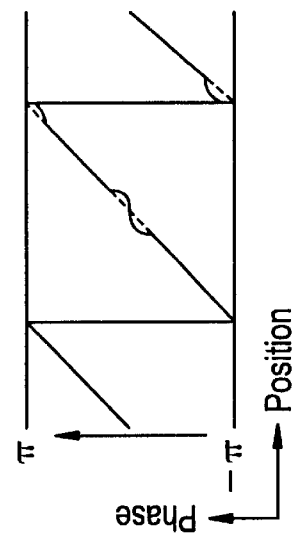
FIGS. 19(a)–19(c) are a diagram describing the function of the data processing unit shown in FIG. 16.
Figure 19B:
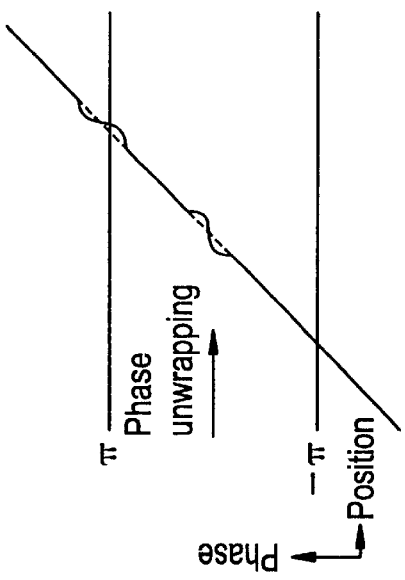

This phase distribution is input to a phase unwrapping unit 914. The unwrapping unit 914 unwraps the phase with wraparound shown in FIG. 19(a), so that it is unwrapped as shown in FIG. 19(b).

Figure 19C:
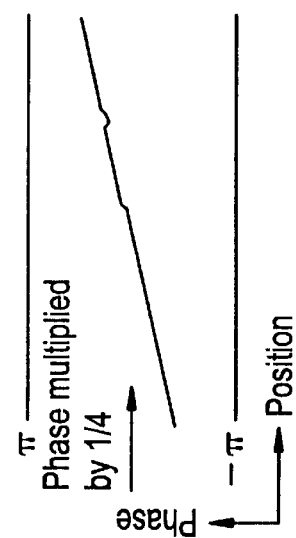

The unwrapped phase distribution is input to a ¼ phase multiplier 916. The ¼ phase multiplier 916 multiplies the input phase by ¼. As a result, the phase distribution shown in FIG. 19(c) is obtained. This phase distribution corresponds to the phase distribution when the imaging object 300 is only water. Therefore, this phase distribution represents the intensity distribution of the stationary magnetic field, i.e., the non-uniformity of the stationary magnetic field.

By replacing this processing by the processing of the phase distribution calculating unit 706 in FIG. 6, and the processing in the phase map forming unit 726 in FIG. 8, a phase map unaffected by the lipid image can be obtained.

Many widely different embodiments of the invention may be configured without departing from the spirit and the scope of the present invention. It should be understood that the present invention is not limited to the specific embodiments described in the specification, except as defined in the appended claims.

What is claimed is:

1. A phase correction method comprising the steps of:

lowpass filtering an image obtaind by magnetic resonance imaging;

detecting a range of pixel positions defined by values "e" at one end and "E" at another end, wherein $$\frac{\text{signal intensity after filtering}}{\text{signal intensity before filtering}} \leq e \quad \text{and}$$

$$\frac{\text{signal intensity before filtering}}{\text{signal intensity after filtering}} \geq E$$

so as to provide a range of detected pixel positions;

calculating a phase distribution based on the image before said lowpass filtering or the image after said lowpass filtering excluding pixel data within said range of detected pixel positions so as to provide a calculated phase distribution;

obtaining a compensated phase distribution by estimating the phase at said excluded range of detected pixel positions in said calculated phase distribution from the phase at neighboring pixel positions; and performing phase correction of the image using said compensated phase distribution.

2. A phase correcting apparatus comprising:

filtering means for lowpass filtering an image obtained by magnetic resonance imageing:

detecting means for detecting a range of pixel positions defined by values "e" at one end and "E" at another end, wherein $$\frac{\text{signal intensity after filtering}}{\text{signal intensity before filtering}} \leq e \quad \text{and}$$

$$\frac{\text{signal intensity before filtering}}{\text{signal intensity after filtering}} \geq E$$

so as to provide a range of detected pixel positions;

calculating means for calculating a phase distribution based on the image before lowpass filtering or the image after said low-pass filtering excluding pixel data within said range of detected pixel positions so as to provide a calculated phase distribution;

compensating means for obtaining a compensated phase distribution by estimating the phase at said excluded range of detected pixel positions in said calculated phase distribution from the phase at neighboring pixel positions; and correcting means for phase correcting said image using said compensated phase distribution.

3. A phase correction method comprising the steps of:

lowpass filtering an image obtained by magnetic resonance imaging to produce a lowpass filtered image;

calculating a phase distribution based on said lowpass filtered image to provide a calculated phase distribution;

phase correcting the image before said lowpass filtering based on said calculated phase distribution to provide a phase corrected image;

lowpass filtering said phase corrected image to provide a new lowpass filtered image;

calculating a new phase distribution based on said new lowpass filtered image to provide a new calculated phase distribution; and phase correcting said phase corrected image based on said new calculated phase distribution.

4. The method of claim 3, wherein all of the foregoing steps are repeated cyclically.

5. The method of claim 4, wherein said lowpass filtering is progressively weakened each time said lowpass filtering is provided.

6. The method of claim 4, wherein said lowpass filtering is progressively strengthened each time said lowpass filtering is provided.

7. A phase correction apparatus comprising:
   filtering means for lowpass filtering an image obtained by magnetic resonance imaging;
   calculating means for calculating a phase distribution based on said lowpass filtered image;
   correcting means for phase correcting the image before said lowpass filtering based on said calculated phase distribution; and
   control means for causing lowpass filtering of said phase corrected image again by said filtering means, calculating of a new phase distribution by said calculating means based on said new lowpass filtered image, and phase correcting of said phase corrected image again by said correcting means based on said new calculated phase distribution.

8. The apparatus of claim 7, wherein said control means causes cyclical repeated operation of said filtering means, said calculating means, and said correcting means.

9. The apparatus of claim 8, wherein said control means causes said filtering means to provide lowpass filtering which is progressively weakened each time of filtering.

10. The apparatus of claim 8, wherein said control means causes said filtering means to provide lowpass filtering which is progressively strengthened each time of filtering.

11. A magnetic resonance imaging apparatus comprising:
    imaging means for acquiring an image of an imaging object using magnetic resonance;
    filtering means for lowpass filtering said image obtained by magnetic resonance imaging;
    detecting means for detecting pixel positions for which ratio of signal intensity after lowpass filtering to signal intensity before lowpass filtering does not exceed a predetermined value and for providing detected pixel positions;
    calculating means for calculating a phase distribution based on said image before said lowpass filtering or said image after said lowpass filtering excluding pixel data at said detected pixel positions;
    compensation means for estimating phase at said excluded pixel positions in said calculated phase distribution from phase at neighboring pixel positions to provide compensated phase distribution;
    correcting means for phase correcting said image using said compensated phase distribution; and
    generating means for generating a water image and a lipid image separately using a phase difference of pixel data of phase corrected image.

12. A magnetic resonance imaging method comprising the steps of:
    taking an image of an imaging object using magnetic resonance;
    lowpass filtering said image obtained by magnetic resonance imaging;
    detecting pixel positions for which ratio of signal intensity before lowpass filtering to signal intensity after lowpass filtering exceeds . a predetermined value and providing detected pixel positions;
    calculating a phase distribution based on said image before said lowpass filtering or said image after said lowpass filtering excluding pixel data at said detected pixel positions;
    estimating phase at said excluded pixel positions in said calculated phase distribution from pase at neighboring pixel positions to provided compensated phase distribution;
    correcting said image using said compensated phase distribution to obtain a phase corrected image; and
    generating a water image and a lipid image separately using a phase difference of pixel data of said phase corrected image.

13. A magnetic resoance imaging apparatus comprising:
    imaging means for acquiring an image of an imaging object using magnetic resonance imaging;
    filtering means for lowpass filtering said image obtained by magnetic resonance imaging to provide a low pass filtered image;
    calculating means for calculating a phase distribution based on said lowpass filtered image to provide a calculated phase distribution;
    correcting means for phase correcting said image before lowpass filtering based on said calculated phase distribution to provided a phase corrected image;
    control means for causing lowpass filtering of said phase corrected image again by said filtering means, calculating of a new phase distribution by said calculating means based on a new lowpass filtered image, and correcting said phase corrected image again by said correcting means based on a new calculated phase distribution; and
    generating means for generating a water image and a lipid image separately using a phase difference of pixel data of the phase corrected image.

14. The apparatus of claim 13, wherein said control means causes cyclical operation of said filtering means, said calculating means and said correcting means.

15. The apparatus of claim 14, further comprising means for adjusting said filtering means so that lowpass filtering is progressively weakened for each filtering step.

16. The apparatus of claim 14, further comprising means for adjusting said filtering means so that lowpass filtering is progressively strengthened with each filtering step.

17. A magnetic resonance imaging method comprising the steps of:
    taking an image of an imaging object using magnetic resonance;
    lowpass filtering said image obtained by magnetic resonance imaging;
    calculating a phase distribution based on the lowpass filtered image;
    phase correcting the image before lowpass filtering based on the calculated phase distribution obtained in the prior step;
    lowpass filtering the phase corrected image obtained in the prior step;
    calculating a new phase distribution based on the new lowpass filtered image obtained in the prior step;
    phase correcting the phase corrected image again based on the new calculated phase distribution obtained in the prior step; and
    generating a water image and a lipid image separately using a phase difference of pixel data of the phase corrected image obtained in the prior step.

* * * * *